(12) United States Patent
Harwood et al.

(10) Patent No.: US 7,595,632 B2
(45) Date of Patent: *Sep. 29, 2009

(54) WAFER PROBE STATION HAVING ENVIRONMENT CONTROL ENCLOSURE

(75) Inventors: Warren K. Harwood, Vancouver, WA (US); Paul A. Tervo, Vancouver, WA (US); Martin J. Koxxy, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/006,438

(22) Filed: Jan. 2, 2008

(65) Prior Publication Data

US 2008/0106290 A1 May 8, 2008

Related U.S. Application Data

(60) Continuation of application No. 11/317,400, filed on Dec. 22, 2005, now Pat. No. 7,348,787, which is a continuation of application No. 10/925,526, filed on Aug. 25, 2004, now Pat. No. 7,009,383, which is a continuation of application No. 10/441,646, filed on May 19, 2003, now Pat. No. 6,801,047, which is a continuation of application No. 10/268,244, filed on Oct. 9, 2002, now Pat. No. 6,636,059, which is a continuation of application No. 10/068,728, filed on Feb. 6, 2002, now Pat. No. 6,486,687, which is a continuation of application No. 09/886,353, filed on Jun. 20, 2001, now Pat. No. 6,380,751, which is a continuation of application No. 08/790,969, filed on Jan. 29, 1997, now Pat. No. 6,313,649, which is a continuation of application No. 08/641,029, filed on Apr. 29, 1996, now Pat. No. 5,604,444, which is a continuation of application No. 08/417,982, filed on Apr. 6, 1995, now Pat. No. 5,532,609, which is a division of application No. 08/245,581, filed on May 18, 1994, now Pat. No. 5,434,512, which is a division of application No. 07/896,853, filed on Jun. 11, 1992, now Pat. No. 5,345,170.

(51) Int. Cl.
*G01R 31/02* (2006.01)
(52) U.S. Cl. .................................. 324/158.1; 324/754
(58) Field of Classification Search ......... 324/754–765, 324/158.1
See application file for complete search history.

(56) References Cited

U.S. PATENT DOCUMENTS 1,191,486 A 7/1916 Tyler (Continued)

FOREIGN PATENT DOCUMENTS

CN 1083975 3/1994

(Continued)

OTHER PUBLICATIONS

Mark S. Boguski and Martin W. McIntosh, "Biomedical informatics for proteomics," insight: review article, Nature 422, 233-237 (2003); doi:10.1038/nature01515.

(Continued)

*Primary Examiner*—Ernest F Karlsen
(74) *Attorney, Agent, or Firm*—Chernoff, Vilhauer, McClung & Stenzel

(57) ABSTRACT

A wafer probe station is equipped with an integrated environment control enclosure substantially surrounding a supporting surface for holding a test device, such enclosure limiting fluid communication between the interior and exterior of the enclosure and preferably also providing EMI shielding and a dark environment. The limited communication between the interior and exterior of the enclosure is kept substantially constant despite positioning movement of either the supporting surface or probes. The positioning mechanisms for the supporting surface and probes each are located at least partially outside of the enclosure.

9 Claims, 7 Drawing Sheets

U.S. PATENT DOCUMENTS

| | | |
|---|---|---|
| 1,337,866 A | 4/1920 | Whitacker |
| 2,142,625 A | 1/1939 | Zoethout |
| 2,197,081 A | 4/1940 | Piron |
| 2,264,685 A | 12/1941 | Wells |
| 2,376,101 A | 5/1945 | Tyzzer |
| 2,389,668 A | 11/1945 | Johnson |
| 2,471,897 A | 5/1949 | Rappi |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radziekowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,359,014 A | 12/1967 | Clements |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,642,415 A | 2/1972 | Johnson |
| 3,648,169 A | 3/1972 | Wiesler |
| 3,654,573 A | 4/1972 | Graham |
| 3,662,318 A | 5/1972 | Decuyper |
| 3,666,296 A | 5/1972 | Fischetti |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,775,644 A | 11/1973 | Cotner et al. |
| 3,777,260 A | 12/1973 | Davies et al. |
| 3,810,017 A | 5/1974 | Wiesler et al. |
| 3,814,838 A | 6/1974 | Shafer |
| 3,814,888 A | 6/1974 | Bowers et al. |
| 3,829,076 A | 8/1974 | Sofy |
| 3,836,751 A | 9/1974 | Anderson |
| 3,858,212 A | 12/1974 | Tompkins et al. |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,976,959 A | 8/1976 | Gaspari |
| 3,992,073 A | 11/1976 | Buchoff et al. |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,135,131 A | 1/1979 | Larsen et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshirch et al. |
| 4,287,473 A | 9/1981 | Sawyer |
| 4,327,180 A | 4/1982 | Chen |
| 4,330,783 A | 5/1982 | Toia |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,383,217 A | 5/1983 | Shiell |
| 4,401,945 A | 8/1983 | Juengel |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,431,967 A | 2/1984 | Nishioka |
| 4,453,142 A | 6/1984 | Murphy |
| 4,468,629 A | 8/1984 | Choma, Jr. |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,532,423 A | 7/1985 | Tojo et al. |
| 4,552,033 A | 11/1985 | Marzhauser |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,588,950 A | 5/1986 | Henley |
| 4,588,970 A | 5/1986 | Donecker et al. |
| 4,621,169 A | 11/1986 | Petinelli et al. |
| 4,626,618 A | 12/1986 | Takaoka et al. |
| 4,641,659 A | 2/1987 | Sepponen |
| 4,642,417 A | 2/1987 | Ruthrof et al. |
| 4,646,005 A | 2/1987 | Ryan |
| 4,651,115 A | 3/1987 | Wu |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,783 A | 8/1987 | Gore |
| 4,684,883 A | 8/1987 | Ackerman et al. |
| 4,691,163 A | 9/1987 | Blass et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,705,447 A | 11/1987 | Smith |
| 4,711,563 A | 12/1987 | Lass |
| 4,712,370 A | 12/1987 | MacGee |
| 4,713,347 A | 12/1987 | Mitchell et al. |
| 4,725,793 A | 2/1988 | Igarashi |
| 4,727,637 A | 3/1988 | Buckwitz et al. |
| 4,730,158 A | 3/1988 | Kasai et al. |
| 4,731,577 A | 3/1988 | Logan |

| | | | | | | |
|---|---|---|---|---|---|---|
| 4,734,872 A | 3/1988 | Eager et al. | | 5,019,692 A | 5/1991 | Nbedi et al. |
| 4,739,259 A | 4/1988 | Hadwin et al. | | 5,030,907 A | 7/1991 | Yih et al. |
| 4,742,571 A | 5/1988 | Letron | | 5,034,688 A | 7/1991 | Moulene et al. |
| 4,744,041 A | 5/1988 | Strunk et al. | | 5,041,782 A | 8/1991 | Marzan |
| 4,746,857 A | 5/1988 | Sakai et al. | | 5,045,781 A | 9/1991 | Gleason et al. |
| 4,754,239 A | 6/1988 | Sedivec | | 5,061,823 A | 10/1991 | Carroll |
| 4,755,746 A | 7/1988 | Mallory et al. | | 5,065,089 A | 11/1991 | Rich |
| 4,755,747 A | 7/1988 | Sato | | 5,065,092 A | 11/1991 | Sigler |
| 4,755,874 A | 7/1988 | Esrig et al. | | 5,066,357 A | 11/1991 | Smyth, Jr. et al. |
| 4,757,255 A | 7/1988 | Margozzi | | 5,070,297 A | 12/1991 | Kwon et al. |
| 4,758,785 A | 7/1988 | Rath | | 5,077,523 A | 12/1991 | Blanz |
| 4,759,712 A | 7/1988 | Demand | | 5,082,627 A | 1/1992 | Stanbro |
| 4,766,384 A | 8/1988 | Kleinberg et al. | | 5,084,671 A | 1/1992 | Miyata et al. |
| 4,771,234 A | 9/1988 | Cook et al. | | 5,089,774 A | 2/1992 | Nakano |
| 4,772,846 A | 9/1988 | Reeds | | 5,091,691 A | 2/1992 | Kamieniecki et al. |
| 4,777,434 A | 10/1988 | Miller et al. | | 5,091,692 A | 2/1992 | Ohno et al. |
| 4,780,670 A | 10/1988 | Cherry | | 5,091,732 A | 2/1992 | Mileski et al. |
| 4,783,625 A | 11/1988 | Harry et al. | | 5,094,536 A | 3/1992 | MacDonald et al. |
| 4,784,213 A | 11/1988 | Eager et al. | | 5,095,891 A | 3/1992 | Reitter |
| 4,786,867 A | 11/1988 | Yamatsu | | 5,097,207 A | 3/1992 | Blanz |
| 4,787,752 A | 11/1988 | Fraser et al. | | 5,101,149 A | 3/1992 | Adams et al. |
| 4,791,363 A | 12/1988 | Logan | | 5,101,453 A | 3/1992 | Rumbaugh |
| 4,795,962 A | 1/1989 | Yanagawa et al. | | 5,103,169 A | 4/1992 | Heaton et al. |
| 4,805,627 A | 2/1989 | Klingenbeck et al. | | 5,105,148 A | 4/1992 | Lee |
| 4,810,981 A | 3/1989 | Herstein | | 5,105,181 A | 4/1992 | Ross |
| 4,812,754 A | 3/1989 | Tracy et al. | | 5,107,076 A | 4/1992 | Bullock et al. |
| 4,816,767 A | 3/1989 | Cannon et al. | | 5,136,237 A | 8/1992 | Smith et al. |
| 4,818,169 A | 4/1989 | Schram et al. | | 5,142,224 A | 8/1992 | Smith et al. |
| 4,827,211 A | 5/1989 | Strid et al. | | 5,144,228 A | 9/1992 | Sorna et al. |
| 4,831,494 A | 5/1989 | Arnold et al. | | 5,159,264 A | 10/1992 | Anderson |
| 4,838,802 A | 6/1989 | Soar | | 5,159,267 A | 10/1992 | Anderson |
| 4,839,587 A | 6/1989 | Flatley et al. | | 5,159,752 A | 11/1992 | Mahant-Shetti et al. |
| 4,845,426 A | 7/1989 | Nolan et al. | | 5,160,883 A | 11/1992 | Blanz |
| 4,849,689 A | 7/1989 | Gleason et al. | | 5,164,319 A | 11/1992 | Hafeman et al. |
| 4,853,613 A | 8/1989 | Sequeira et al. | | 5,164,661 A | 11/1992 | Jones |
| 4,853,624 A | 8/1989 | Rabjohn | | 5,166,606 A | 11/1992 | Blanz |
| 4,853,627 A | 8/1989 | Gleason et al. | | 5,172,049 A | 12/1992 | Kiyokawa et al. |
| 4,856,426 A | 8/1989 | Wirz | | 5,172,051 A | 12/1992 | Zamborelli |
| 4,856,904 A | 8/1989 | Akagawa | | 5,187,443 A | 2/1993 | Bereskin |
| 4,858,160 A | 8/1989 | Strid et al. | | 5,198,752 A | 3/1993 | Miyata et al. |
| 4,859,989 A | 8/1989 | McPherson | | 5,198,753 A | 3/1993 | Hamburgen |
| 4,864,227 A | 9/1989 | Sato | | 5,198,756 A | 3/1993 | Jenkins et al. |
| 4,871,883 A | 10/1989 | Guiol | | 5,198,758 A | 3/1993 | Iknaian et al. |
| 4,871,965 A | 10/1989 | Elbert et al. | | 5,202,558 A | 4/1993 | Barker |
| 4,884,026 A | 11/1989 | Hayakawa et al. | | 5,209,088 A | 5/1993 | Vaks |
| 4,884,206 A | 11/1989 | Mate | | 5,210,377 A | 5/1993 | Kennedy et al. |
| 4,888,550 A | 12/1989 | Reid | | 5,210,485 A | 5/1993 | Kreiger et al. |
| 4,891,584 A | 1/1990 | Kamieniecki et al. | | 5,214,243 A | 5/1993 | Johnson |
| 4,893,914 A | 1/1990 | Hancock et al. | | 5,214,374 A | 5/1993 | St. Onge |
| 4,894,612 A | 1/1990 | Drake et al. | | 5,218,185 A | 6/1993 | Gross |
| 4,896,109 A | 1/1990 | Rauscher | | 5,220,277 A | 6/1993 | Reitinger |
| 4,899,998 A | 2/1990 | Teramachi | | 5,221,905 A | 6/1993 | Bhangu et al. |
| 4,904,933 A | 2/1990 | Snyder et al. | | 5,225,037 A | 7/1993 | Elder et al. |
| 4,904,935 A | 2/1990 | Calma et al. | | 5,225,796 A | 7/1993 | Williams et al. |
| 4,906,920 A | 3/1990 | Huff et al. | | 5,227,730 A | 7/1993 | King et al. |
| 4,916,398 A | 4/1990 | Rath | | 5,232,789 A | 8/1993 | Platz et al. |
| 4,918,279 A | 4/1990 | Babel et al. | | 5,233,197 A | 8/1993 | Bowman et al. |
| 4,918,374 A | 4/1990 | Stewart et al. | | 5,233,291 A | 8/1993 | Kouno et al. |
| 4,918,383 A | 4/1990 | Huff et al. | | 5,233,306 A | 8/1993 | Misra |
| 4,922,128 A | 5/1990 | Dhong et al. | | 5,237,267 A * | 8/1993 | Harwood et al. ............ 324/754 |
| 4,922,186 A | 5/1990 | Tsuchiya et al. | | 5,245,292 A | 9/1993 | Milesky et al. |
| 4,923,407 A | 5/1990 | Rice et al. | | 5,266,889 A * | 11/1993 | Harwood et al. ............ 324/754 |
| 4,926,118 A * | 5/1990 | O'Connor et al. ............ 324/760 | | 5,267,088 A | 11/1993 | Nomura |
| 4,929,893 A | 5/1990 | Sato et al. | | 5,270,664 A | 12/1993 | McMurtry et al. |
| 4,933,634 A | 6/1990 | Cuzin et al. | | 5,274,336 A | 12/1993 | Crook et al. |
| 4,968,931 A | 11/1990 | Littlebury et al. | | 5,278,494 A | 1/1994 | Obigane |
| 4,978,907 A | 12/1990 | Smith | | 5,280,156 A | 1/1994 | Niori et al. |
| 4,978,914 A | 12/1990 | Akimoto et al. | | 5,298,972 A | 3/1994 | Heffner |
| 4,982,153 A | 1/1991 | Collins et al. | | 5,303,938 A | 4/1994 | Miller et al. |
| 4,994,737 A | 2/1991 | Carlton et al. | | 5,304,924 A | 4/1994 | Yamano et al. |
| 5,001,423 A | 3/1991 | Abrami et al. | | 5,315,237 A | 5/1994 | Iwakura et al. |
| 5,006,796 A | 4/1991 | Burton et al. | | 5,321,352 A | 6/1994 | Takebuchi |
| 5,010,296 A | 4/1991 | Okada et al. | | 5,321,453 A | 6/1994 | Mori et al. |

| Patent | Date | Inventor |
|---|---|---|
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,357,211 A | 10/1994 | Bryson et al. |
| 5,363,050 A | 11/1994 | Guo et al. |
| 5,369,368 A | 11/1994 | Kassen et al. |
| 5,369,370 A | 11/1994 | Stratmann et al. |
| 5,371,457 A | 12/1994 | Lipp |
| 5,373,231 A | 12/1994 | Boll et al. |
| 5,374,938 A | 12/1994 | Hatazawa et al. |
| 5,376,790 A | 12/1994 | Linker et al. |
| 5,382,898 A | 1/1995 | Subramanian |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,410,259 A | 4/1995 | Fujihara et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,434,512 A | 7/1995 | Schwindt et al. |
| 5,448,172 A | 9/1995 | Dechene et al. |
| 5,451,884 A | 9/1995 | Sauerland |
| 5,457,398 A | 10/1995 | Schwindt et al. |
| 5,461,328 A | 10/1995 | Devereaux et al. |
| 5,467,024 A | 11/1995 | Swapp |
| 5,469,324 A | 11/1995 | Henderson et al. |
| 5,475,316 A | 12/1995 | Hurley et al. |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,512,835 A | 4/1996 | Rivera et al. |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,528,158 A | 6/1996 | Sinsheimer et al. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,539,676 A | 7/1996 | Yamaguchi |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A | 9/1996 | Singles et al. |
| 5,561,377 A | 10/1996 | Strid et al. |
| 5,561,585 A | 10/1996 | Barnes et al. |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,572,398 A | 11/1996 | Federlin et al. |
| 5,578,932 A | 11/1996 | Adamian |
| 5,583,445 A | 12/1996 | Mullen |
| 5,584,608 A | 12/1996 | Gillespie |
| 5,594,358 A | 1/1997 | Ishikawa et al. |
| 5,600,256 A | 2/1997 | Woith et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,628,057 A | 5/1997 | Phillips et al. |
| 5,629,631 A | 5/1997 | Perry et al. |
| 5,631,571 A | 5/1997 | Spaziani et al. |
| 5,633,780 A | 5/1997 | Cronin |
| 5,640,101 A | 6/1997 | Kuji et al. |
| 5,642,298 A | 6/1997 | Mallory et al. |
| 5,644,248 A | 7/1997 | Fujimoto |
| 5,646,538 A | 7/1997 | Lide et al. |
| 5,653,939 A | 8/1997 | Hollis et al. |
| 5,656,942 A | 8/1997 | Watts et al. |
| 5,657,394 A | 8/1997 | Schwartz et al. |
| 5,659,255 A | 8/1997 | Strid et al. |
| 5,659,421 A | 8/1997 | Rahmel et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,322 A | 9/1997 | Eggers et al. |
| 5,670,888 A | 9/1997 | Cheng |
| 5,672,816 A | 9/1997 | Park et al. |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishawy et al. |
| 5,685,232 A | 11/1997 | Inoue |
| 5,704,355 A | 1/1998 | Bridges |
| 5,712,571 A | 1/1998 | O'Donoghue |
| 5,715,819 A | 2/1998 | Svenson et al. |
| 5,729,150 A | 3/1998 | Schwindt |
| 5,731,708 A | 3/1998 | Sobhani |
| 5,731,920 A | 3/1998 | Katsuragawa |
| 5,744,971 A | 4/1998 | Chan et al. |
| 5,748,506 A | 5/1998 | Bockelman |
| 5,751,252 A | 5/1998 | Phillips |
| 5,767,690 A | 6/1998 | Fujimoto |
| 5,773,951 A | 6/1998 | Markowski et al. |
| 5,777,485 A | 7/1998 | Tanaka et al. |
| 5,792,668 A | 8/1998 | Fuller et al. |
| 5,793,213 A | 8/1998 | Bockelman et al. |
| 5,794,133 A | 8/1998 | Kashima |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,824,494 A | 10/1998 | Feldberg |
| 5,828,225 A | 10/1998 | Obikane et al. |
| 5,829,437 A | 11/1998 | Bridges |
| 5,831,442 A | 11/1998 | Heigl |
| 5,833,601 A | 11/1998 | Swartz et al. |
| 5,835,997 A | 11/1998 | Yassine et al. |
| 5,838,161 A | 11/1998 | Akram et al. |
| 5,841,288 A | 11/1998 | Meaney et al. |
| 5,846,708 A | 12/1998 | Hollis et al. |
| 5,847,569 A | 12/1998 | Ho et al. |
| 5,848,500 A | 12/1998 | Kirk |
| 5,852,232 A | 12/1998 | Samsavar et al. |
| 5,854,608 A | 12/1998 | Leisten |
| 5,857,667 A | 1/1999 | Lee |
| 5,861,743 A | 1/1999 | Pye et al. |
| 5,867,073 A | 2/1999 | Weinreb et al. |
| 5,869,326 A | 2/1999 | Hofmann |
| 5,869,975 A | 2/1999 | Strid et al. |
| 5,874,361 A | 2/1999 | Collins et al. |

| | | | | | | |
|---|---|---|---|---|---|---|
| 5,879,289 | A | 3/1999 | Yarush et al. | 6,124,725 A | 9/2000 | Sato |
| 5,883,522 | A | 3/1999 | O'Boyle | 6,127,831 A | 10/2000 | Khoury et al. |
| 5,883,523 | A | 3/1999 | Ferland et al. | 6,130,544 A | 10/2000 | Strid et al. |
| 5,888,075 | A | 3/1999 | Hasegawa et al. | 6,137,302 A | 10/2000 | Schwindt |
| 5,892,539 | A | 4/1999 | Colvin | 6,137,303 A | 10/2000 | Deckert et al. |
| 5,900,737 | A | 5/1999 | Graham et al. | 6,144,212 A | 11/2000 | Mizuta |
| 5,903,143 | A | 5/1999 | Mochizuki et al. | 6,147,502 A | 11/2000 | Fryer et al. |
| 5,905,421 | A | 5/1999 | Oldfield | 6,147,851 A | 11/2000 | Anderson |
| 5,910,727 | A | 6/1999 | Fujihara et al. | 6,160,407 A | 12/2000 | Nikawa |
| 5,916,689 | A | 6/1999 | Collins et al. | 6,161,294 A | 12/2000 | Bland et al. |
| 5,923,177 | A | 7/1999 | Wardwell | 6,166,553 A | 12/2000 | Sinsheimer |
| 5,926,028 | A | 7/1999 | Mochizuki | 6,169,410 B1 | 1/2001 | Grace et al. |
| 5,942,907 | A | 8/1999 | Chiang | 6,172,337 B1 | 1/2001 | Johnsgard et al. |
| 5,944,093 | A | 8/1999 | Viswanath | 6,175,228 B1 | 1/2001 | Zamborelli et al. |
| 5,945,836 | A | 8/1999 | Sayre et al. | 6,181,144 B1 | 1/2001 | Hembree et al. |
| 5,949,383 | A | 9/1999 | Hayes et al. | 6,181,149 B1 | 1/2001 | Godfrey et al. |
| 5,949,579 | A | 9/1999 | Baker | 6,181,297 B1 | 1/2001 | Leisten |
| 5,952,842 | A | 9/1999 | Fujimoto | 6,181,416 B1 | 1/2001 | Falk |
| 5,959,461 | A | 9/1999 | Brown et al. | 6,184,845 B1 | 2/2001 | Leisten et al. |
| 5,960,411 | A | 9/1999 | Hartman et al. | 6,191,596 B1 | 2/2001 | Abiko |
| 5,963,027 | A | 10/1999 | Peters | 6,194,720 B1 | 2/2001 | Li et al. |
| 5,963,364 | A | 10/1999 | Leong et al. | 6,194,907 B1 | 2/2001 | Kanao et al. |
| 5,970,429 | A | 10/1999 | Martin | 6,198,299 B1 | 3/2001 | Hollman |
| 5,973,505 | A | 10/1999 | Strid et al. | 6,211,663 B1 | 4/2001 | Moulthrop et al. |
| 5,974,662 | A | 11/1999 | Eldridge et al. | 6,211,837 B1 | 4/2001 | Crouch et al. |
| 5,981,268 | A | 11/1999 | Kovacs et al. | 6,215,295 B1 | 4/2001 | Smith, III |
| 5,982,166 | A | 11/1999 | Mautz | 6,222,031 B1 | 4/2001 | Wakabayashi et al. |
| 5,993,611 | A | 11/1999 | Moroney, III et al. | 6,222,970 B1 | 4/2001 | Wach et al. |
| 5,995,914 | A | 11/1999 | Cabot | 6,229,322 B1 | 5/2001 | Hembree |
| 5,996,102 | A | 11/1999 | Haulin | 6,229,327 B1 | 5/2001 | Boll et al. |
| 5,998,768 | A | 12/1999 | Hunter et al. | 6,232,787 B1 | 5/2001 | Lo et al. |
| 5,999,268 | A | 12/1999 | Yonezawa et al. | 6,232,788 B1 | 5/2001 | Schwindt et al. |
| 6,001,760 | A | 12/1999 | Katsuda et al. | 6,232,789 B1 | 5/2001 | Schwindt |
| 6,002,236 | A | 12/1999 | Trant et al. | 6,232,790 B1 | 5/2001 | Bryan et al. |
| 6,002,263 | A | 12/1999 | Peters et al. | 6,233,613 B1 | 5/2001 | Walker et al. |
| 6,002,426 | A | 12/1999 | Back et al. | 6,236,223 B1 | 5/2001 | Brady et al. |
| 6,013,586 | A | 1/2000 | McGhee et al. | 6,236,975 B1 | 5/2001 | Boe et al. |
| 6,019,612 | A | 2/2000 | Hasegawa et al. | 6,236,977 B1 | 5/2001 | Verba et al. |
| 6,023,209 | A | 2/2000 | Faulkner et al. | 6,242,929 B1 | 6/2001 | Mizuta |
| 6,028,435 | A | 2/2000 | Nikawa | 6,245,692 B1 | 6/2001 | Pearce et al. |
| 6,029,141 | A | 2/2000 | Bezos et al. | 6,251,595 B1 | 6/2001 | Gordon et al. |
| 6,031,383 | A | 2/2000 | Streib et al. | 6,252,392 B1 | 6/2001 | Peters |
| 6,032,714 | A | 3/2000 | Fenton | 6,257,319 B1 | 7/2001 | Kainuma et al. |
| 6,034,533 | A | 3/2000 | Tervo et al. | 6,257,564 B1 | 7/2001 | Avneri et al. |
| 6,037,785 | A | 3/2000 | Higgins | 6,259,261 B1 | 7/2001 | Engelking et al. |
| 6,037,793 | A | 3/2000 | Miyazawa et al. | 6,265,950 B1 | 7/2001 | Schmidt et al. |
| 6,043,667 | A | 3/2000 | Cadwallader et al. | 6,271,673 B1 | 8/2001 | Furuta et al. |
| 6,043,668 | A | 3/2000 | Carney | 6,275,738 B1 | 8/2001 | Kasevich et al. |
| 6,049,216 | A | 4/2000 | Yang et al. | 6,278,051 B1 | 8/2001 | Peabody |
| 6,051,422 | A | 4/2000 | Kovacs et al. | 6,278,411 B1 | 8/2001 | Ohlsson et al. |
| 6,052,653 | A | 4/2000 | Mazur et al. | 6,281,691 B1 | 8/2001 | Matsunaga et al. |
| 6,054,869 | A | 4/2000 | Hutton et al. | 6,284,971 B1 | 9/2001 | Atalar et al. |
| 6,060,888 | A | 5/2000 | Blackham et al. | 6,288,557 B1 | 9/2001 | Peters et al. |
| 6,060,891 | A | 5/2000 | Hembree et al. | 6,292,760 B1 | 9/2001 | Burns |
| 6,060,892 | A | 5/2000 | Yamagata | 6,300,775 B1 | 10/2001 | Peach et al. |
| 6,061,589 | A | 5/2000 | Bridges et al. | 6,307,672 B1 | 10/2001 | DeNure |
| 6,064,213 | A | 5/2000 | Khandros et al. | 6,310,483 B1 | 10/2001 | Taura et al. |
| 6,064,217 | A | 5/2000 | Smith | 6,310,755 B1 | 10/2001 | Kholodenko et al. |
| 6,064,218 | A | 5/2000 | Godfrey et al. | 6,313,567 B1 | 11/2001 | Maltabes et al. |
| 6,066,911 | A | 5/2000 | Lindemann et al. | 6,313,649 B2 | 11/2001 | Harwood et al. |
| 6,078,183 | A | 6/2000 | Cole, Jr. | 6,320,372 B1 | 11/2001 | Keller |
| 6,091,236 | A | 7/2000 | Piety et al. | 6,320,396 B1 | 11/2001 | Nikawa |
| 6,091,255 | A | 7/2000 | Godfrey | 6,327,034 B1 | 12/2001 | Hoover et al. |
| 6,096,567 | A | 8/2000 | Kaplan et al. | 6,335,625 B1 | 1/2002 | Bryant et al. |
| 6,100,815 | A | 8/2000 | Pailthorp | 6,335,628 B1 | 1/2002 | Schwindt et al. |
| 6,104,203 | A | 8/2000 | Costello et al. | 6,340,568 B2 | 1/2002 | Hefti |
| 6,104,206 | A | 8/2000 | Verkuil | 6,340,895 B1 | 1/2002 | Uher et al. |
| 6,111,419 | A | 8/2000 | Lefever et al. | 6,359,456 B1 | 3/2002 | Hembree et al. |
| 6,114,865 | A | 9/2000 | Lagowski et al. | 6,362,636 B1 | 3/2002 | Peters et al. |
| 6,118,287 | A | 9/2000 | Boll et al. | 6,362,792 B1 | 3/2002 | Sawamura et al. |
| 6,118,894 | A | 9/2000 | Schwartz et al. | 6,366,247 B1 | 4/2002 | Sawamura et al. |
| 6,121,783 | A | 9/2000 | Horner et al. | 6,369,776 B1 | 4/2002 | Leisten et al. |
| 6,124,723 | A | 9/2000 | Costello | 6,376,258 B2 | 4/2002 | Hefti |

| | | | | | | |
|---|---|---|---|---|---|---|
| 6,380,751 | B2 | 4/2002 | Harwood et al. | 6,710,798 | B1 | 3/2004 | Hershel et al. |
| 6,384,614 | B1 | 5/2002 | Hager et al. | 6,717,426 | B2 | 4/2004 | Iwasaki |
| 6,395,480 | B1 | 5/2002 | Hefti | 6,720,782 | B2 | 4/2004 | Schwindt et al. |
| 6,396,296 | B1 | 5/2002 | Tarter et al. | 6,724,205 | B1 | 4/2004 | Hayden et al. |
| 6,396,298 | B1 | 5/2002 | Young et al. | 6,724,928 | B1 | 4/2004 | Davis |
| 6,400,168 | B2 | 6/2002 | Matsunaga et al. | 6,727,716 | B1 | 4/2004 | Sharif |
| 6,404,213 | B2 | 6/2002 | Noda | 6,731,804 | B1 | 5/2004 | Carrieri et al. |
| 6,407,560 | B1 | 6/2002 | Walraven et al. | 6,734,687 | B1 | 5/2004 | Ishitani et al. |
| 6,407,562 | B1 | 6/2002 | Whiteman | 6,737,920 | B2 | 5/2004 | Jen et al. |
| 6,409,724 | B1 | 6/2002 | Penny et al. | 6,739,208 | B2 | 5/2004 | Hyakudomi |
| 6,414,478 | B1 | 7/2002 | Suzuki | 6,744,268 | B2 | 6/2004 | Hollman |
| 6,415,858 | B1 | 7/2002 | Getchel et al. | 6,753,679 | B1 | 6/2004 | Kwong et al. |
| 6,418,009 | B1 | 7/2002 | Brunette | 6,753,699 | B2 | 6/2004 | Stockstad |
| 6,420,722 | B2 | 7/2002 | Moore et al. | 6,756,751 | B2 | 6/2004 | Hunter |
| 6,424,141 | B1 | 7/2002 | Hollman et al. | 6,768,328 | B2 | 7/2004 | Self et al. |
| 6,424,316 | B1 | 7/2002 | Leisten et al. | 6,770,955 | B1 | 8/2004 | Coccioli et al. |
| 6,445,202 | B1 | 9/2002 | Cowan et al. | 6,771,090 | B2 | 8/2004 | Harris et al. |
| 6,447,339 | B1 | 9/2002 | Reed et al. | 6,771,806 | B1 | 8/2004 | Satya et al. |
| 6,448,788 | B1 | 9/2002 | Meaney et al. | 6,774,651 | B1 | 8/2004 | Hembree |
| 6,459,739 | B1 | 10/2002 | Vitenberg | 6,777,964 | B2 | 8/2004 | Navratil et al. |
| 6,466,046 | B1 | 10/2002 | Maruyama et al. | 6,778,140 | B1 | 8/2004 | Yeh |
| 6,468,816 | B2 | 10/2002 | Hunter | 6,784,679 | B2 | 8/2004 | Sweet et al. |
| 6,476,442 | B1 | 11/2002 | Williams et al. | 6,788,093 | B2 | 9/2004 | Aitren et al. |
| 6,480,013 | B1 | 11/2002 | Nayler et al. | 6,791,344 | B2 | 9/2004 | Cook et al. |
| 6,481,939 | B1 | 11/2002 | Gillespie et al. | 6,794,888 | B2 | 9/2004 | Kawaguchi et al. |
| 6,483,327 | B1 | 11/2002 | Bruce et al. | 6,794,950 | B2 | 9/2004 | Du Toit et al. |
| 6,483,336 | B1 | 11/2002 | Harris et al. | 6,798,226 | B2 | 9/2004 | Altmann et al. |
| 6,486,687 | B2 | 11/2002 | Harwood et al. | 6,801,047 | B2 | 10/2004 | Harwood et al. |
| 6,488,405 | B1 | 12/2002 | Eppes et al. | 6,806,724 | B2 | 10/2004 | Hayden et al. |
| 6,489,789 | B2 | 12/2002 | Peters et al. | 6,806,836 | B2 | 10/2004 | Ogawa et al. |
| 6,490,471 | B2 | 12/2002 | Svenson et al. | 6,809,533 | B1 | 10/2004 | Anlage et al. |
| 6,492,822 | B2 | 12/2002 | Schwindt et al. | 6,812,718 | B1 | 11/2004 | Chong et al. |
| 6,501,289 | B1 | 12/2002 | Takekoshi | 6,822,463 | B1 | 11/2004 | Jacobs |
| 6,512,391 | B2 | 1/2003 | Cowan et al. | 6,836,135 | B2 | 12/2004 | Harris et al. |
| 6,512,482 | B1 | 1/2003 | Nelson et al. | 6,838,885 | B2 | 1/2005 | Kamitani |
| 6,515,494 | B1 | 2/2003 | Low | 6,842,024 | B2 | 1/2005 | Peters et al. |
| 6,528,993 | B1 | 3/2003 | Shin et al. | 6,843,024 | B2 | 1/2005 | Nozaki et al. |
| 6,529,844 | B1 | 3/2003 | Kapetanic et al. | 6,847,219 | B1 | 1/2005 | Lesher et al. |
| 6,548,311 | B1 | 4/2003 | Knoll | 6,856,129 | B2 | 2/2005 | Thomas et al. |
| 6,549,022 | B1 | 4/2003 | Cole, Jr. et al. | 6,861,856 | B2 | 3/2005 | Dunklee et al. |
| 6,549,026 | B1 | 4/2003 | DiBattista et al. | 6,864,694 | B2 | 3/2005 | McTigue |
| 6,549,106 | B2 | 4/2003 | Martin | 6,873,167 | B2 | 3/2005 | Goto et al. |
| 6,566,079 | B2 | 5/2003 | Hefti | 6,885,197 | B2 | 4/2005 | Harris et al. |
| 6,573,702 | B2 | 6/2003 | Marcuse et al. | 6,900,646 | B2 | 5/2005 | Kasukabe et al. |
| 6,578,264 | B1 | 6/2003 | Gleason et al. | 6,900,647 | B2 | 5/2005 | Yoshida et al. |
| 6,580,283 | B1 | 6/2003 | Carbone et al. | 6,900,652 | B2 | 5/2005 | Mazur |
| 6,582,979 | B2 | 6/2003 | Coccioli et al. | 6,900,653 | B2 | 5/2005 | Yu et al. |
| 6,587,327 | B1 | 7/2003 | Devoe et al. | 6,902,941 | B2 | 6/2005 | Sun |
| 6,603,322 | B1 | 8/2003 | Boll et al. | 6,903,563 | B2 | 6/2005 | Yoshida et al. |
| 6,605,951 | B1 | 8/2003 | Cowan | 6,914,244 | B2 | 7/2005 | Alani |
| 6,605,955 | B1 | 8/2003 | Costello et al. | 6,914,580 | B2 | 7/2005 | Leisten |
| 6,608,494 | B1 | 8/2003 | Bruce et al. | 6,924,656 | B2 | 8/2005 | Matsumoto |
| 6,608,496 | B1 | 8/2003 | Strid et al. | 6,927,079 | B1 | 8/2005 | Fyfield |
| 6,611,417 | B2 | 8/2003 | Chen | 6,937,341 | B1 | 8/2005 | Woollam et al. |
| 6,617,862 | B1 | 9/2003 | Bruce | 6,970,001 | B2 | 11/2005 | Chheda et al. |
| 6,621,082 | B2 | 9/2003 | Morita et al. | 6,987,483 | B2 | 1/2006 | Tran |
| 6,624,891 | B2 | 9/2003 | Marcus et al. | 7,001,785 | B1 | 2/2006 | Chen |
| 6,627,461 | B2 | 9/2003 | Chapman et al. | 7,002,133 | B2 | 2/2006 | Beausoleil et al. |
| 6,628,503 | B2 | 9/2003 | Sogard | 7,002,363 | B2 | 2/2006 | Mathieu |
| 6,628,980 | B2 | 9/2003 | Atalar et al. | 7,002,364 | B2 | 2/2006 | Kang et al. |
| 6,633,174 | B1 | 10/2003 | Satya et al. | 7,003,184 | B2 | 2/2006 | Ronnekleiv et al. |
| 6,636,059 | B2 | 10/2003 | Harwood et al. | 7,005,842 | B2 | 2/2006 | Fink et al. |
| 6,636,182 | B2 | 10/2003 | Mehltretter | 7,005,868 | B2 | 2/2006 | McTigue |
| 6,639,415 | B2 | 10/2003 | Peters et al. | 7,005,879 | B1 | 2/2006 | Robertazzi |
| 6,639,461 | B1 | 10/2003 | Tam et al. | 7,006,046 | B2 | 2/2006 | Aisenbrey |
| 6,642,732 | B2 | 11/2003 | Cowan et al. | 7,007,380 | B2 | 3/2006 | Das et al. |
| 6,643,597 | B1 | 11/2003 | Dunsmore | 7,009,188 | B2 | 3/2006 | Wang |
| 6,650,135 | B1 | 11/2003 | Mautz et al. | 7,009,383 | B2 | 3/2006 | Harwood et al. |
| 6,653,903 | B2 | 11/2003 | Leich et al. | 7,009,415 | B2 | 3/2006 | Kobayashi et al. |
| 6,657,601 | B2 | 12/2003 | McLean | 7,011,531 | B2 | 3/2006 | Egitto et al. |
| 6,686,753 | B1 | 2/2004 | Kitahata | 7,012,425 | B2 | 3/2006 | Shoji |
| 6,701,265 | B2 | 3/2004 | Hill et al. | 7,012,441 | B2 | 3/2006 | Chou et al. |
| 6,707,548 | B2 | 3/2004 | Kreimer et al. | 7,013,221 | B1 | 3/2006 | Friend et al. |

| | | |
|---|---|---|
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,101,797 B2 | 9/2006 | Yuasa |
| 7,138,813 B2 | 11/2006 | Cowan et al. |
| 7,187,188 B2 | 3/2007 | Andrews et al. |
| 7,188,037 B2 | 3/2007 | Hidehira |
| 7,221,172 B2 | 5/2007 | Dunklee |
| 7,250,779 B2 | 7/2007 | Dunklee et al. |
| 7,362,115 B2 | 4/2008 | Andrews et al. |
| 2001/0002794 A1 | 6/2001 | Draving et al. |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0066551 A1 | 6/2002 | Stone et al. |
| 2002/0070743 A1 | 6/2002 | Felici et al. |
| 2002/0070745 A1 | 6/2002 | Johnson et al. |
| 2002/0075027 A1 | 6/2002 | Hollman et al. |
| 2002/0079911 A1 | 6/2002 | Schwindt |
| 2002/0118009 A1 | 8/2002 | Hollman et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0071631 A1 | 4/2003 | Alexander |
| 2003/0072549 A1 | 4/2003 | Facer et al. |
| 2003/0077649 A1 | 4/2003 | Cho et al. |
| 2003/0088180 A1 | 5/2003 | VanVeen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0141861 A1 | 7/2003 | Navratil et al. |
| 2003/0155939 A1 | 8/2003 | Lutz et al. |
| 2003/0156270 A1 | 8/2003 | Hunter |
| 2003/0170898 A1 | 9/2003 | Gundersen et al. |
| 2003/0184332 A1 | 10/2003 | Tomimatsu et al. |
| 2004/0015060 A1 | 1/2004 | Samsoondar et al. |
| 2004/0021475 A1 | 2/2004 | Ito et al. |
| 2004/0061514 A1 | 4/2004 | Schwindt et al. |
| 2004/0066181 A1 | 4/2004 | Thies |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113639 A1 | 6/2004 | Dunklee et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0147034 A1 | 7/2004 | Gore et al. |
| 2004/0162689 A1 | 8/2004 | Jamneala et al. |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2004/0267691 A1 | 12/2004 | Vasudeva |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0083130 A1 | 4/2005 | Grilo |
| 2005/0099192 A1 | 5/2005 | Dunklee et al. |
| 2005/0101846 A1 | 5/2005 | Fine et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0174191 A1 | 8/2005 | Brunker et al. |
| 2005/0178980 A1 | 8/2005 | Skidmore et al. |
| 2005/0195124 A1 | 9/2005 | Puente Baliarda et al. |
| 2005/0227503 A1 | 10/2005 | Reitinger |
| 2005/0236587 A1 | 10/2005 | Kodama et al. |
| 2005/0237102 A1 | 10/2005 | Tanaka |
| 2006/0052075 A1 | 3/2006 | Galivanche et al. |
| 2006/0114012 A1 | 6/2006 | Reitinger |
| 2006/0155270 A1 | 7/2006 | Hancock et al. |
| 2006/0158207 A1 | 7/2006 | Reitinger |
| 2006/0226864 A1 | 10/2006 | Kramer |
| 2007/0024506 A1 | 2/2007 | Hardacker |
| 2007/0030021 A1 | 2/2007 | Cowan et al. |

FOREIGN PATENT DOCUMENTS

| | | |
|---|---|---|
| DE | 29 12 826 | 10/1980 |

| | | |
|---|---|---|
| DE | 31 14 466 | 3/1982 |
| DE | 31 25 552 | 11/1982 |
| DE | 36 37 549 | 5/1988 |
| DE | 41 09 908 | 10/1992 |
| DE | 43 16 111 | 11/1994 |
| DE | 94 06 227 | 10/1995 |
| DE | 195 41 334 | 9/1996 |
| DE | 196 16 212 | 10/1996 |
| DE | 195 22 774 | 1/1997 |
| DE | 196 18 717 | 1/1998 |
| DE | 288 234 | 3/1999 |
| DE | 693 22 206 | 4/1999 |
| DE | 100 00 324 | 7/2001 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 | 5/1993 |
| EP | 0 706 210 | 4/1996 |
| EP | 0 505 981 | 6/1998 |
| EP | 0 573 183 | 1/1999 |
| EP | 0 945 736 | 9/1999 |
| GB | 2 197 081 | 5/1988 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-011243 | 1/1987 |
| JP | 62-11243 | 1/1987 |
| JP | 62-51235 | 3/1987 |
| JP | 62-098634 | 5/1987 |
| JP | 62-107937 | 5/1987 |
| JP | 62-239050 | 10/1987 |
| JP | 63-108736 | 5/1988 |
| JP | 63-129640 | 6/1988 |
| JP | 63-143814 | 6/1988 |
| JP | 63-160355 | 7/1988 |
| JP | 63-318745 | 12/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22836 | 1/1990 |
| JP | 2-22837 | 1/1990 |
| JP | 2-22873 | 1/1990 |
| JP | 2-124469 | 5/1990 |
| JP | 2-191352 | 7/1990 |
| JP | 2-220453 | 9/1990 |
| JP | 3-67187 | 3/1991 |
| JP | 3-175367 | 7/1991 |
| JP | 3-196206 | 8/1991 |
| JP | 3-228348 | 10/1991 |
| JP | 4-732 | 1/1992 |
| JP | 4-130639 | 5/1992 |
| JP | 4-159043 | 6/1992 |
| JP | 4-206930 | 7/1992 |
| JP | 4-340248 | 11/1992 |
| JP | 5-8476 | 2/1993 |
| JP | 5-082631 | 4/1993 |
| JP | 5-157790 | 6/1993 |
| JP | 51-57790 | 6/1993 |
| JP | 5-166893 | 7/1993 |
| JP | 51-66893 | 7/1993 |
| JP | 6-85044 | 3/1994 |
| JP | 60-71425 | 3/1994 |
| JP | 6-102313 | 4/1994 |
| JP | 6-132709 | 5/1994 |
| JP | 7-005078 | 1/1995 |
| JP | 7-5197 | 1/1995 |
| JP | 7-12871 | 1/1995 |
| JP | 7-84003 | 3/1995 |
| JP | 7-273509 | 10/1995 |
| JP | 8-35987 | 2/1996 |
| JP | 8-261898 | 10/1996 |
| JP | 8-330401 | 12/1996 |
| JP | 10-116866 | 5/1998 |
| JP | 10-339743 | 12/1998 |
| JP | 11-023975 | 1/1999 |
| JP | 11-031724 | 2/1999 |
| JP | 2000-329664 | 11/2000 |
| JP | 2001-124676 | 5/2001 |
| JP | 2001-189285 | 7/2001 |
| JP | 2001-189378 | 7/2001 |
| JP | 2001-358184 | 12/2001 |
| JP | 2002-033374 | 1/2002 |
| JP | 2002/164396 | 6/2002 |
| JP | 2002-203879 | 7/2002 |
| JP | 2002-243502 | 8/2002 |
| SU | 843040 | 6/1981 |
| SU | 1392603 | 4/1988 |
| WO | WO 80/00101 | 1/1980 |
| WO | WO 86/07493 | 12/1986 |
| WO | WO 89/04001 | 5/1989 |
| WO | WO 01/69656 | 9/2001 |
| WO | WO 2004/049395 | 6/2004 |
| WO | WO 2004/065944 | 8/2004 |
| WO | WO 2004/079299 | 9/2004 |
| WO | WO 2005/062025 | 7/2005 |

OTHER PUBLICATIONS

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A new concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70(11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

Christophe Risacher, Vessen Vassilev, Alexey Pavolotsky, and Victor Belitsky, "Waveguide-to-Microstrip Transition With Integrated Bias-T," IEEE Microwave and Wireless Components Letters, vol. 13, No. 7, Jul. 2003, pp. 262-264.

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.

Cascade Microtech, "Introducing the peak of analytical probe stations," MicroProbe Update, May 1990.

H.-J. Eul and B. Schiek, "Thru-Match-Reflect: One Result of a Rigorous Theory for De-Embedding and Network Analyzer Calibration," 18th European Microwave Conference '88, The International Conference Designed for the Microwave Community, Published by Microwave Exhibitions and Publishers Limited, Sep. 12-16, 1988, Stockholm, Sweden.

Cascade Microtech, "Analytical Probe Station," Summit 9000 Series, Jun. 1, 1990.

Maury Microwave Corporation, "MT950D Series, Transistor Test Fixture Software, Software Application Packs," Sep. 20, 1982.

Signatone S-1240 Thermal Controller, 2 page description.

Eric Phizicky, Philippe I.H. Bastiaens, Heng Zhu, Michael Snyder, & Stanley Fields, "Protein analysis on a proteomic scale," Nature 422, insight: review article, Mar. 13, 2003.

The Micromanipulator Company, "Semi-Automatic Probing Stations and Accessories," pp. 1-12.

Integrated Technology Corporation, "Probilt PB500A Probe Card Repair and Analysis Station," 4 pages.

Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.

Eric Strid (Cascade Microtech), "Planar Impedance Standards and Accuracy Considerations in Vector Network Analysis," Jun. 1986, 8 pages.

J. Martens, Anritsu Company, 490 Jarvis Drive, Morgan Hill, CA 95037, "Multiport SOLR Calibrations: Performance and an Analysis of some Standards Dependencies," pp. 205-213.

Maury Microwave Corporation, "MT950 Series Transistor Test Fixture (TTF) Notice! Notice! Notice!," May 31, 1985.

Maury Microwave Corporation, MT950 Series Transistor Test Fixture (TTF), Oct. 7, 1982, 4 pages.

Temptronic Corporation, "Model TPO3000 Series ThermoChuck Systems for Probing, Characterization and Failure analysis of Wafers, Chips and Hybrids at High and Low Temperatures," pp. 2-5.

Cascade Microtech, "Model 42/42D Microwave Probe Station Instruction Manual, Electrical Operation," pp. 4-1-4-42.

Inter-Continental Microwave, "Microwave Semiconductor Chip Measurements using the HP 8510B TRL-Calibration Technique," Application Note: 101.

Design Technique, "Microstrip Microwave Test Fixture," May 1986, 2 pages.

PHOTO: Micromanipulator Probe Station 1994.

Micromanipulator Sales and Services Inc., "Test Station Accessories," Copyright 1983, 1984, 1 page.

Keithley Instruments, Inc. "Low-Level Measurements for Effective Low Current, Low Voltage, and High Impedance Measurements," Revised Third Edition, Printed Jun. 1984.

Inter-Continental Microwave, 2370-B Walsh Avenue, Santa Clara, CA 95051, "Product Catalog".

Hewlett Packard, "HP 4284A Precision LCR Meter Operation Manual (Including Option 001,002,006,201,202,301)," Third Edition, Dec. 1991, pp. 2-1, 6-9, 6-15.

Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.

Cascade Microtech Technical Brief, A Guide to Better Vector Network Analyzer Calibrations for Probe-Tip Measurements, Copyright 1994, 2 pages.

Temptronic, "Guarded" Chuck Sketch, Nov. 15, 1989.

Arthur Fraser, Reed Gleason, E.W. Strid, "GHz On-Silicon-Wafer Probing Calibration Methods," Cascade Microtech Inc. P.O. Box 1589, Beaverton, OR 97075-1589, pp. 5-8.

William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.

Jim Fitzpatrick, "Error Models for Systems Measurement," Microwave Journal, May 1978, pp. 63-66.

Design Technique International, "Adjustable Test Fixture," Copyright 1988.

Ronald F. Bauer & Paul Penfield, Jr., "De-Embedding and Unterminating," IEEE Transactions on Microwave Theory and Techniques, vol. MTT-22, No. 3, Mar. 1974, pp. 282-288.

Cross Section—Signatone S-1240 Sketch, Advertised & Sold 1987-1988.

Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.

R. Y. Koyama & M. G. Buehler, "Semiconductor Measurement Technology: A Wafer Chuck for Use Between -196 and 350° C.," U.S. Department of Commerce, National Technical Information Service, PB-293 298, Issued Jan. 1979.

Ken Cole, "ThermoChuck Performance (Fax)," 2 pages, Mar. 10, 1995.

S. Beck & E. Tomann, "Chip Tester," IBM Technical Disclosure Bulletin, Jan. 1985.

Applied Precision, "Checkpoint," 2 pages, 8505 SE 68th Street, Mercer Island, Washington 98040.

L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.

Daniel Van Der Weide, "THz Frequency Science & Technology Biomolecular Interaction Sensing with Sub-Terahertz Fields," University of Wisconsin-Madison, 2 pages.

Saswata Basu & Reed Gleason, "A Membrane Quadrant Probe for R&D Applications," Cascade Microtech, Inc. 14255 SW Brigadoon Ct., Beaverton, OR 97005, 3 pages.

The Micromanipulator Company, Inc., "Model 8000 Test Station," 1986, 1 page.

The Micromanipulator Company, Inc. "Model 8000 Test Station," 1988, 1 page.

"Vacuum," Mechanical Operation, pp. 3-8-3-9.

The Micromanipulator Company, Inc.,"Accessories: Hot and Hot/Cold Chucks, Integrated Dry environments, Triaxial chucks, Integrated Shielded and Dark environments, Probe Card Holders," p. 8.

Microwave Products, Microwave Journal, Sep. 1988, 1 page.

Cascade Microtech, "Advanced On-Wafer Device Characterization Using the Summit 10500," pp. 2-20.

Hewlett Packard, "HP 4142B Modular DC source/Monitor Practical Applications—High Speed DC Characterization of Semiconductor Devices from Sub pA to 1A," Nov. 1987, pp. 1-4.

Doug Rytting, "Appendix to an Analysis of Vector Measurement Accuracy Enhancement Techniques," pp. 1-42, Hewlett Packard.

Temptronic Corporation, "Application Note 1 Controlled Environment Enclosure For low temperature wafer probing in a moisture-free environment," 2 pages.

*Cascade Microtech, Inc.* vs. *Micromanipulator Company, Inc.*, "Deposition of Harry F. Applebay," United States District Court for the District of Oregon, Lead Case No. 97-479-Al.

Flexion Corporation, "Cryotest Station MP-3," *Cascade Microtech, Inc.* vs. *Micromanipulator Company, Inc.*, Applebay Exhibit 576, May 13, 1998, 68 pages.

Flexion Corporation, "Cryotest Station MP-3," *Cascade Microtech, Inc.* vs. *Micromanipulator Company, Inc.*, Applebay Exhibit 578, May 13, 1998, 1 page.

*Cascade Microtech, Inc.* vs. *Micromanipulator Company, Inc.*, Applebay Exhibit 572, May 13, 1998, 2 pages.

*Cascade Microtech, Inc.* vs. *Micromanipulator Company, Inc.*, Applebay Exhibits 581A, 581B, and 581C, May 13, 1998, 3 pages.

Flexion Corporation, "AP-1 Cryotest Station," Applebay Exhibit 582, May 13, 1998, 20 pages.

Flexion Corporation, "AP-1 Cryotest Station User Manual," Applebay Exhibit 583, May 13, 1998, 187 pages.

*Cascade Microtech, Inc.* vs. *Micromanipulator Company, Inc.*, Applebay Exhibits 577A, 577B, and 577C, May 13, 1998, 3 pages.

*Cascade Microtech, Inc.* vs. *Micromanipulator Company, Inc.*, Applebay Exhibit 585, May 13, 1998, 7 pages.

* cited by examiner

WAFER PROBE STATION HAVING ENVIRONMENT CONTROL ENCLOSURE

CROSS-REFERENCE TO RELATED APPLICATIONS

This application is a continuation of U.S. patent application Ser. No. 11/317,400, filed Dec. 22, 2005, now U.S. Pat. No. 7,348,787; which is a continuation of U.S. patent application Ser. No. 10/925,526, filed Aug. 25, 2004, now U.S. Pat. No. 7,009,383, which is a continuation of U.S. patent application Ser. No. 10/441,646, filed May 19, 2003, now U.S. Pat. No. 6,801,047, which is a continuation of U.S. patent application Ser. No. 10/268,244, filed Oct. 9, 2002, now U.S. Pat. No. 6,636,059, which is a continuation of U.S. patent application Ser. No. 10/068,728, filed Feb. 6, 2002, now U.S. Pat. No. 6,486,687, which is a continuation of U.S. patent application Ser. No. 09/886,353, filed Jun. 20, 2001, now U.S. Pat. No. 6,380,751, which is a continuation of U.S. patent application Ser. No. 08/790,969, filed Jan. 29, 1997, now U.S. Pat. No. 6,313,649, which is a continuation of U.S. patent application Ser. No. 08/641,029, filed Apr. 29, 1996, now U.S. Pat. No. 5,604,444, which is a continuation of U.S. patent application Ser. No. 08/417,982, filed Apr. 6, 1995, now U.S. Pat. No. 5,532,609, which is a division of U.S. patent application Ser. No. 08/245,581, filed May 18, 1994, now U.S. Pat. No. 5,434,512, which is a division of U.S. patent application Ser. No. 07/896,853 filed Jun. 11, 1992, now U.S. Pat. No. 5,345,170.

BACKGROUND OF THE INVENTION

The present invention is directed to probe stations for making highly accurate measurements of high-speed, large scale integrated circuits at the wafer level, and of other electronic devices. More particularly, the invention relates to such a probe station having an environment control enclosure for limiting the communication of the wafer-supporting chuck and probes with outside influences such as electromagnetic interference (EMI), air, and/or light.

BRIEF SUMMARY OF THE INVENTION

The probe station is equipped with an integrated environment control enclosure substantially surrounding a supporting surface for holding a test device, such enclosure limiting fluid communication between the interior and exterior of the enclosure and preferably also providing EMI shielding and a dark environment. The limited communication between the interior and exterior of the enclosure is kept substantially constant despite positioning movement of either the supporting surface or probes. The positioning mechanisms for the supporting surface and probes are each located at least partially outside of the enclosure so that mechanical movement of each of the positioning mechanisms outside of the enclosure causes proportional mechanical movement of the surface or probe.

According to another aspect of the invention, the environment control enclosure has an upper portion extending above the supporting surface and a side portion substantially surrounding the supporting surface, the supporting surface being movable laterally with respect to the top of the side portion.

According to another aspect of the invention, the environment control enclosure has an opening with a closable door for substituting different test devices on the supporting surface in a manner compatible with the positioning and environment control functions.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A is a partial top view of the wafer probe station of FIG. 1 with the enclosure door shown partially open.

FIG. 3A is an enlarged sectional view taken along line 3A-3A of FIG. 3.

DETAILED DESCRIPTION OF PREFERRED EMBODIMENT

General Arrangement of Probe Station

Figure 1:
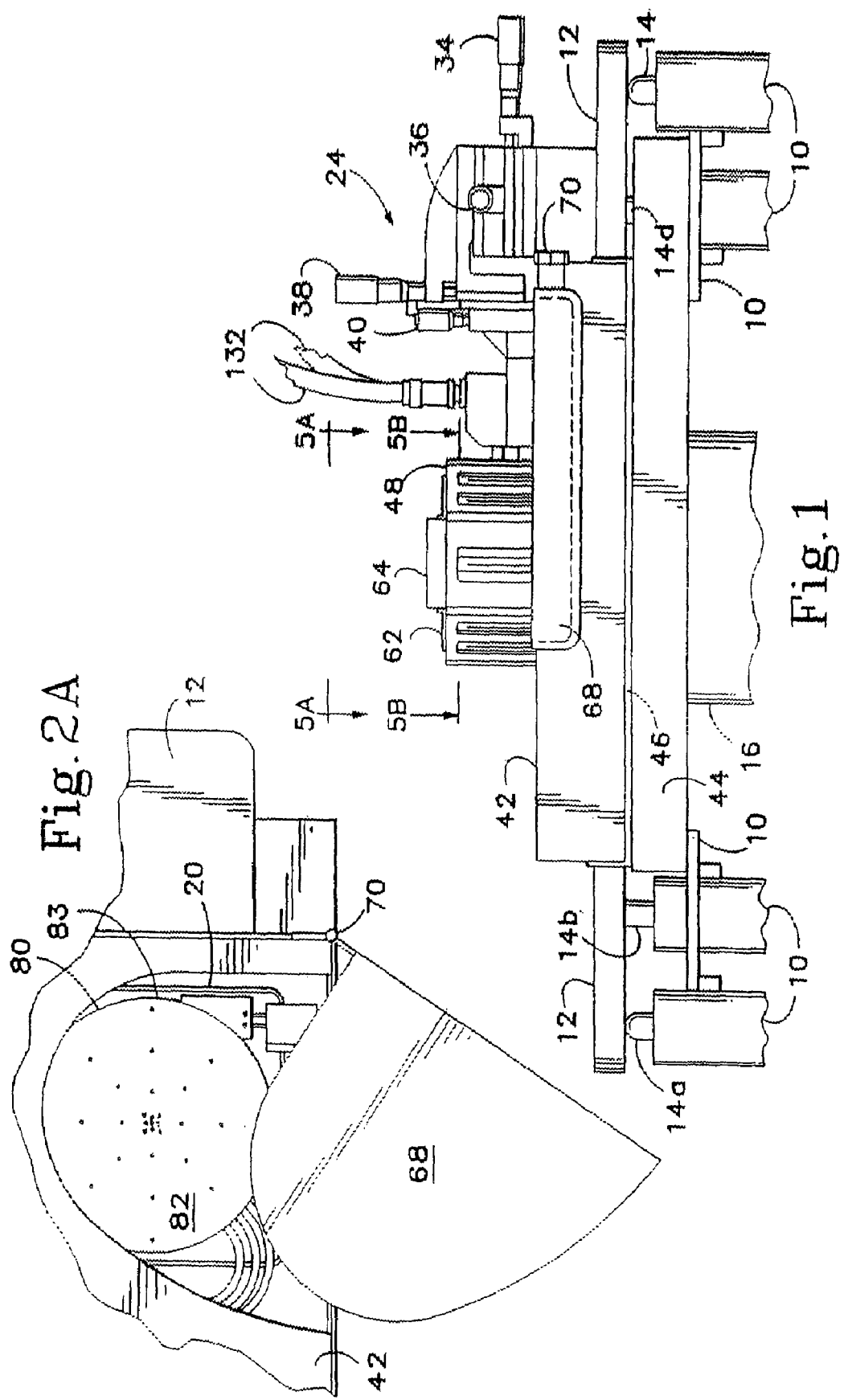
FIG. 1 is a partial front view of an exemplary embodiment of a wafer probe station constructed in accordance with the present invention.
Figure 2:
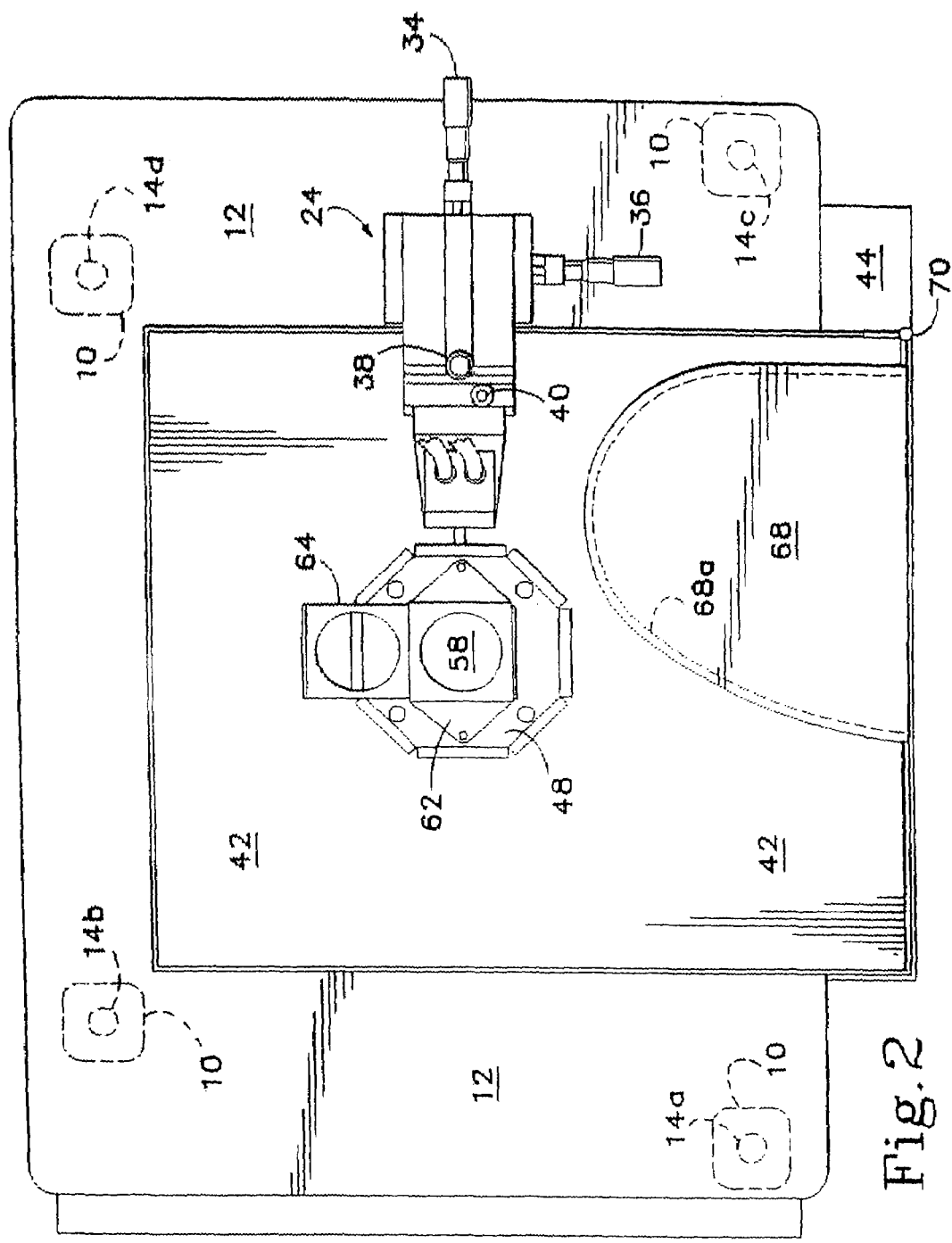
FIG. 2 is a top view of the wafer probe station of FIG. 1.
Figure 3:
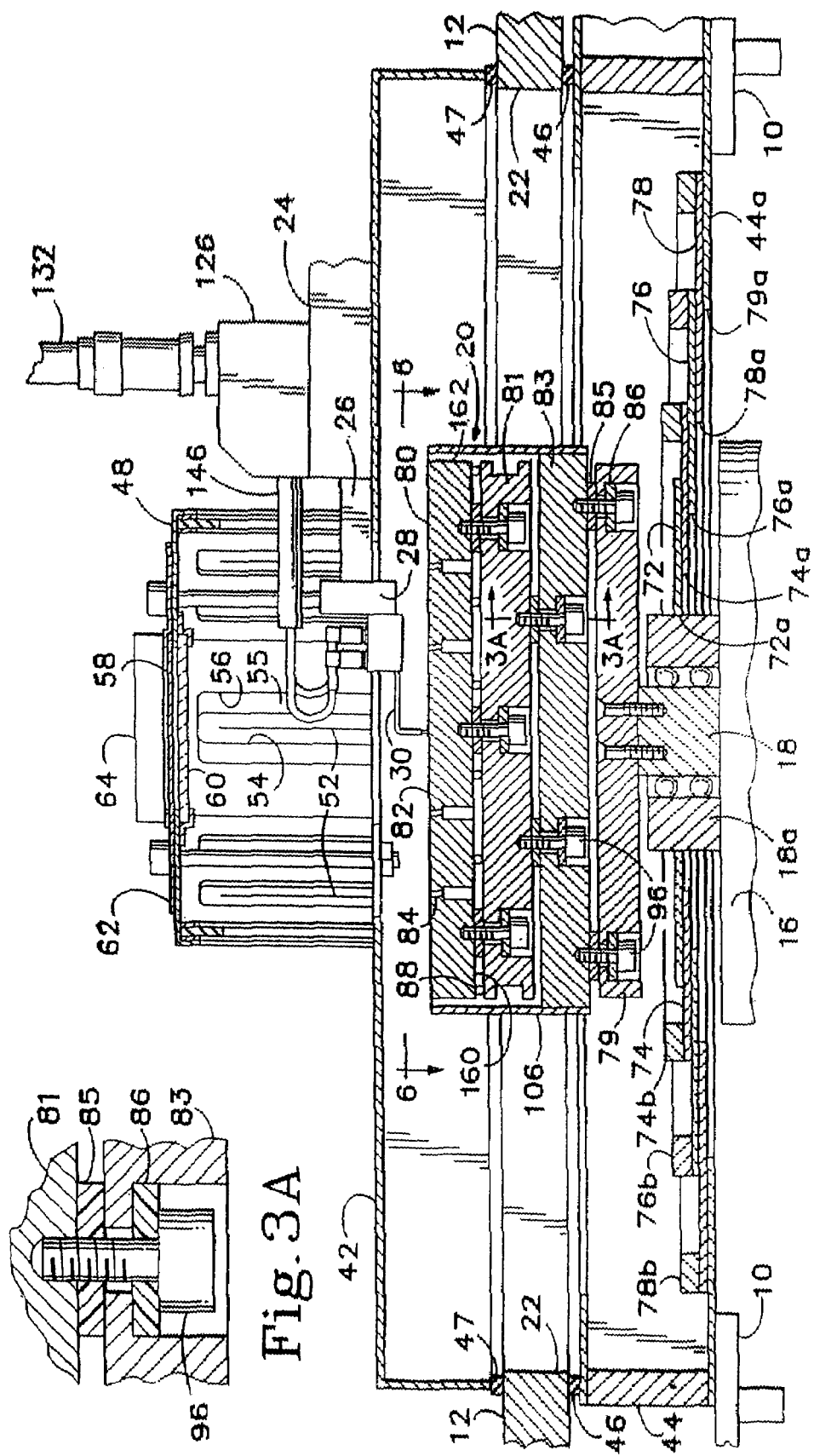
FIG. 3 is a partially sectional and partially schematic front view of the probe station of FIG. 1.

With reference to FIGS. 1, 2 and 3, an exemplary embodiment of the probe station of the present invention comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the Positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
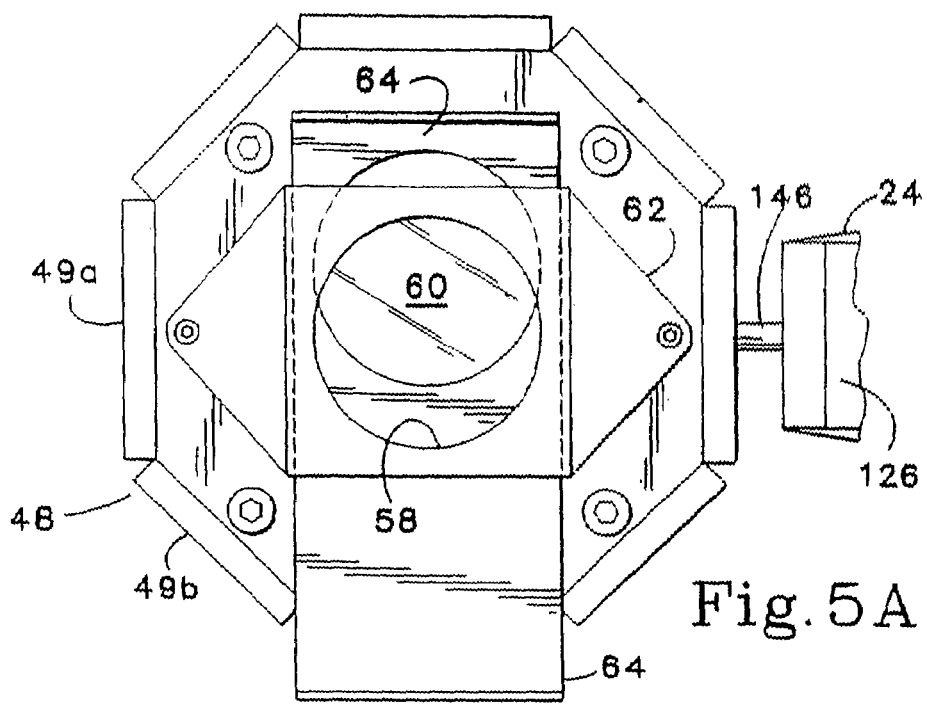
FIG. 5A is an enlarged top detail view taken along line 5A-5A of FIG. 1.
Figure 5B:
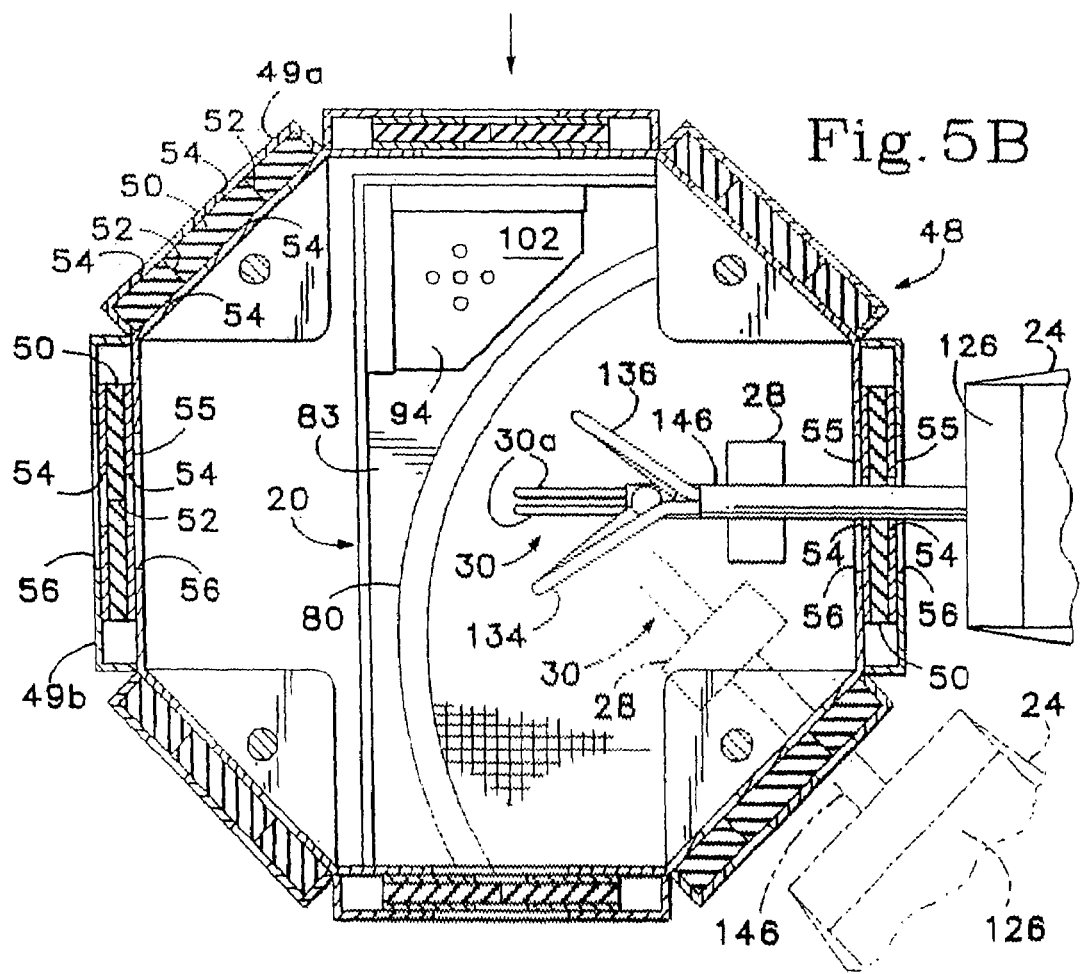
FIG. 5B is an enlarged top sectional view taken along line 5B-5B of FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
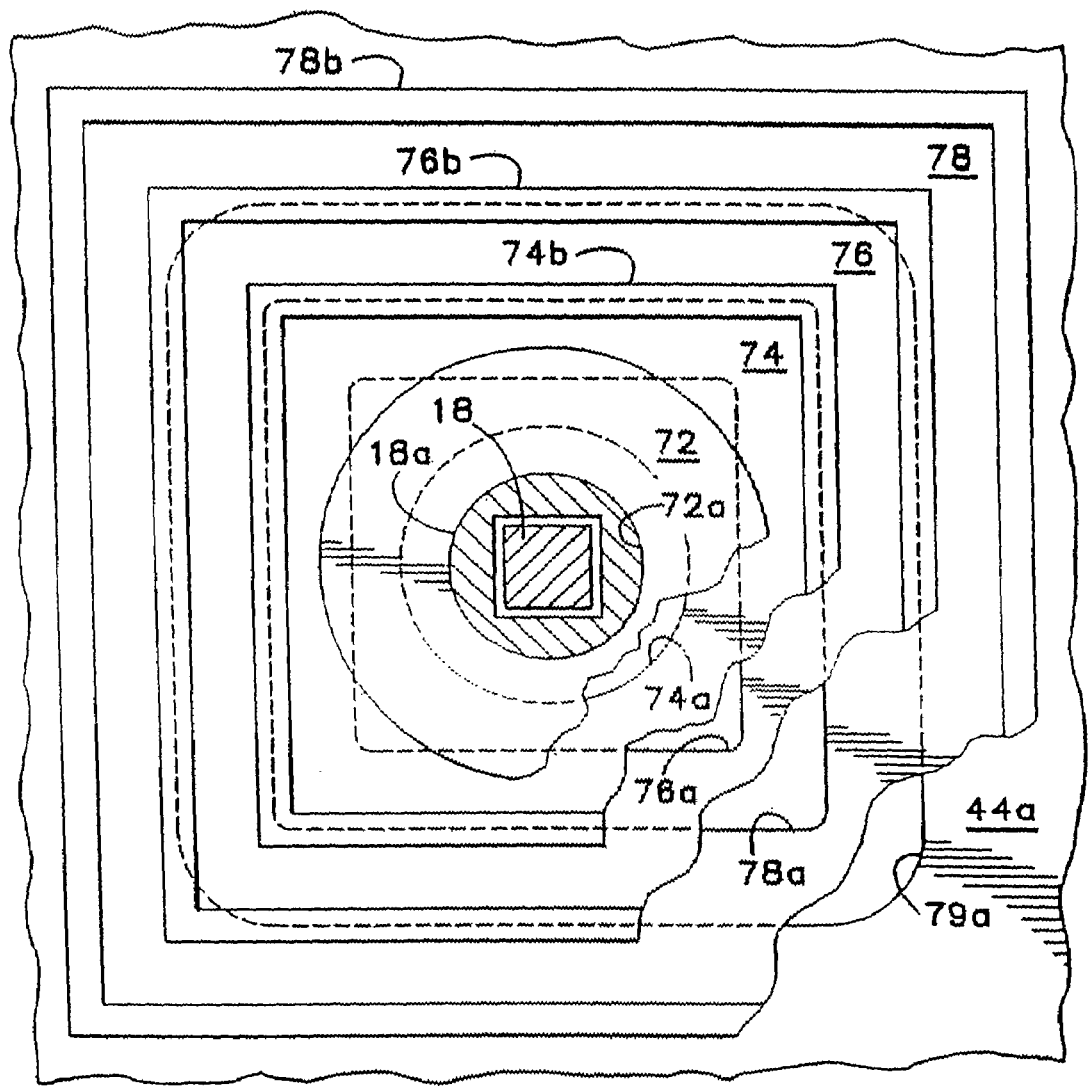
FIG. 4 is a top view of the sealing assembly where the motorized positioning mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Chuck Assembly

Figure 6:
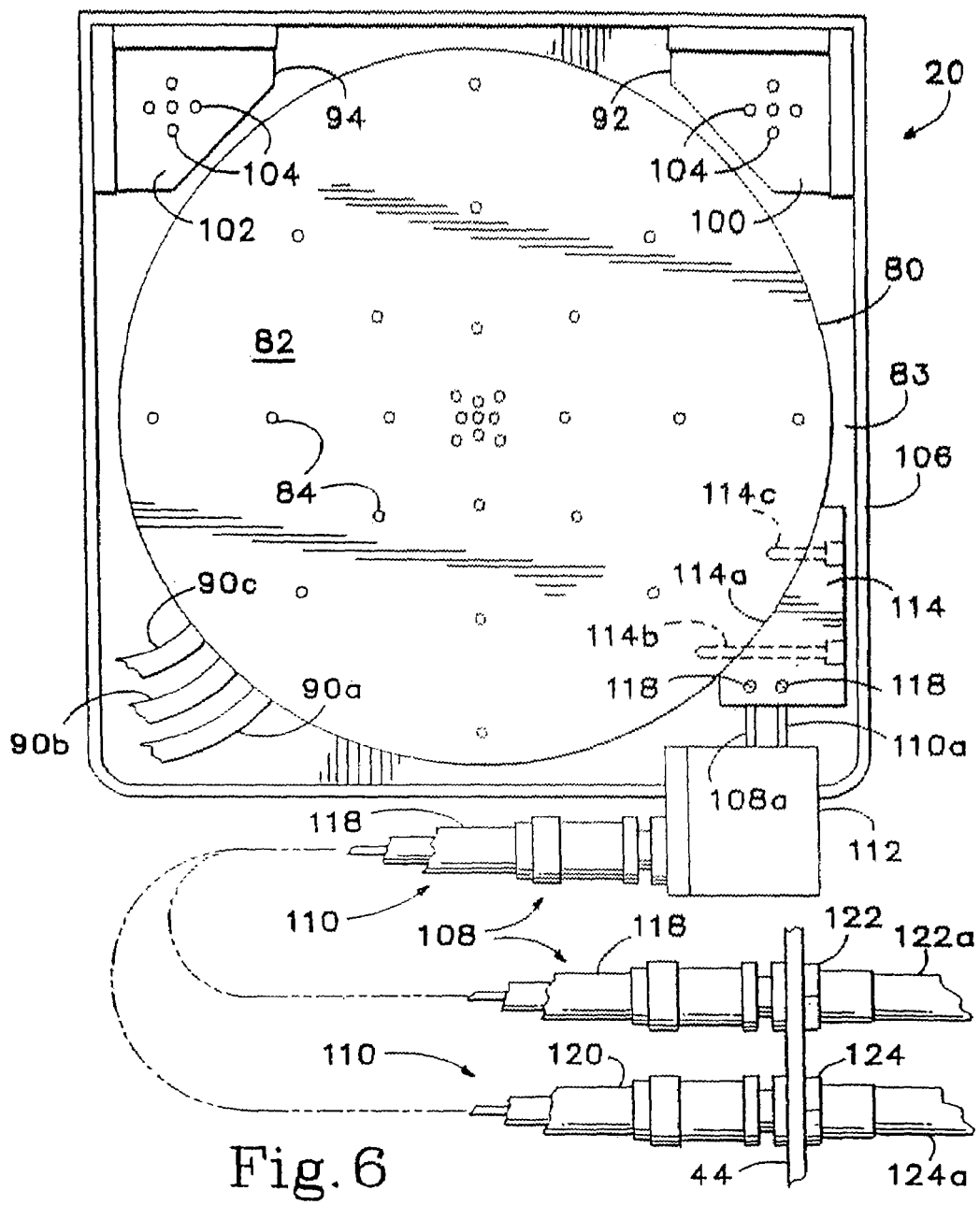
FIG. 6 is a partially schematic top detail view of the chuck assembly, taken along line 6-6 of FIG. 3.
Figure 7:
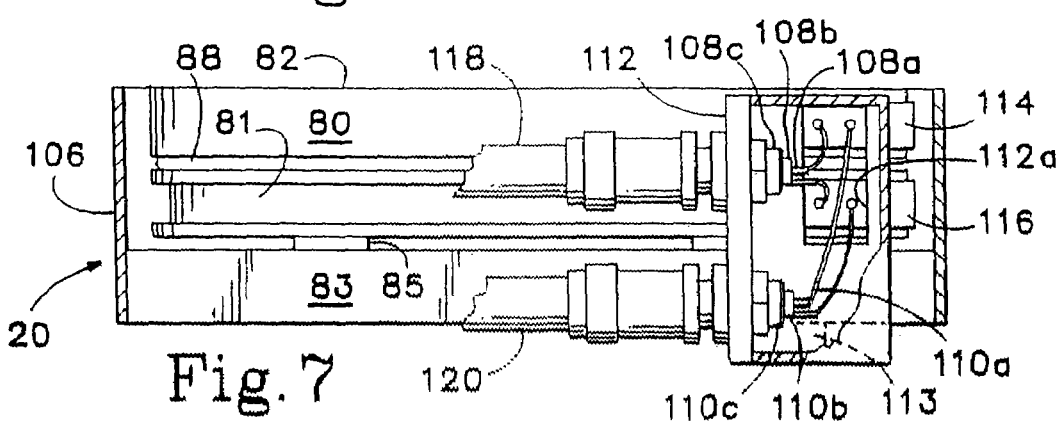
FIG. 7 is a partially sectional front view of the chuck assembly of FIG. 6.

With particular reference to FIGS. 3, 6 and 7, the chuck assembly 20 is of a unique modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. Element 83 is a conductive rectangular stage or shield 83 which detachably mounts conductive elements 80 and 81 of circular shape. The element 80 has a planar upwardly-facing wafer-supporting surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably, the spacers and washers 85 and 86, respectively, are constructed of a material having the lowest possible dielectric constant consistent with high dimensional stability and high volume resistivity. A suitable material for the spacers and washers is glass epoxy, or acetal homopolymer marketed under the trademark Delrin by E.I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b.

In any case, the detachable connector assemblies 108, 110, due to their interconnections with the two connector plates 114, 116, provide immediately ready-to-use signal and guard connections to the chuck assembly elements 80 and 81, respectively, as well as ready-to-use guarded Kelvin connections thereto. For applications requiring only guarding of the chuck assembly, as for example the measurement of low-current leakage from a test device through the element 80, it is necessary only that the operator connect a single guarded cable 122a from a test instrument such as a Hewlett-Packard 4142B modular DC source/monitor to the detachable connector 122 so that a signal line is provided to the chuck assembly element 80 through the connector element 108a and connector plate 114, and a guard line is provided to the element 81 through the connector element 108b and connector plate 116. Alternatively, if a Kelvin connection to the chuck assembly is desired for low-voltage measurements, such as those needed for measurements of low capacitance, the operator need merely attach a pair of cables 122a and 124a to the respective connectors 122, 124 from a suitable test instrument such as a Hewlett-Packard 4284A precision LCR meter, thereby providing both source and measurement lines to the element 80 through the connector elements 108*a* and 110*a* and connector plate 114, and guarding lines to the element 81 through the connector elements 108*b* and 110*b* and connector plate 116.

Probe Assembly

Figure 8:
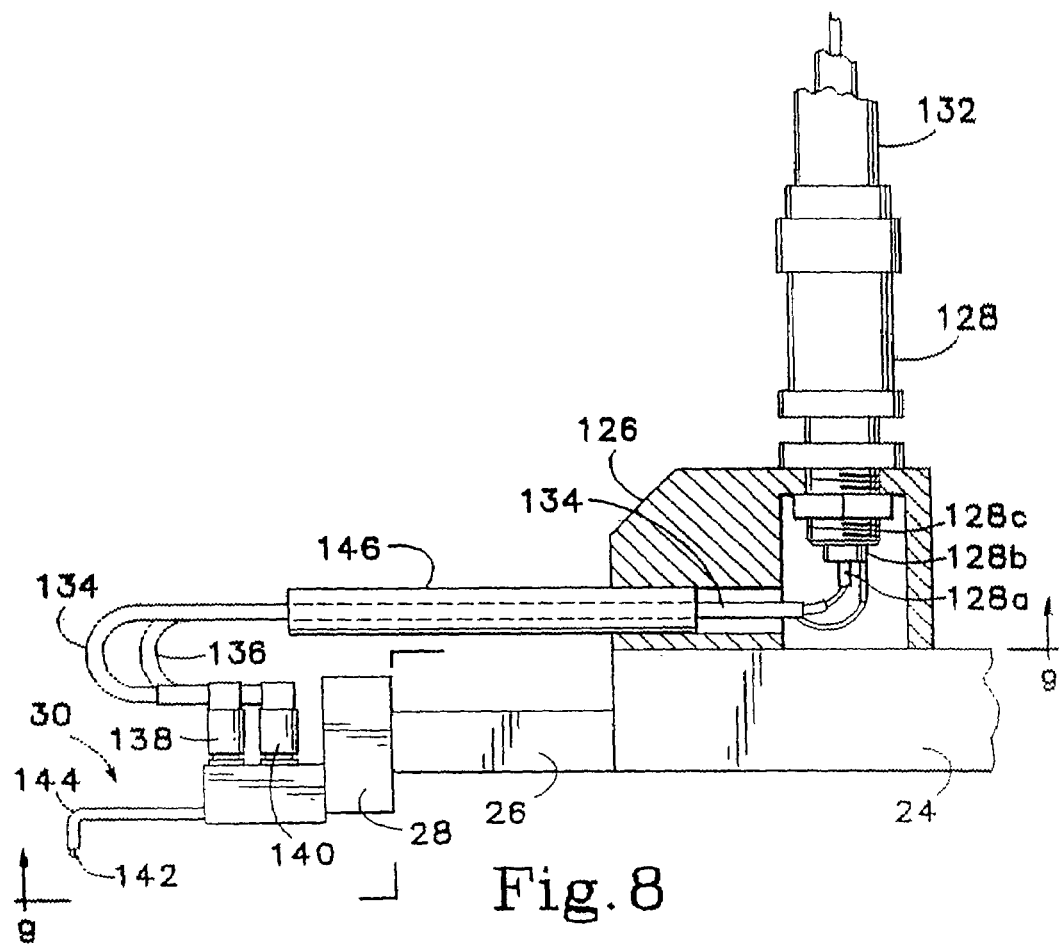
FIG. 8 is a partially sectional side view of a probe holder and probe.
Figure 9:
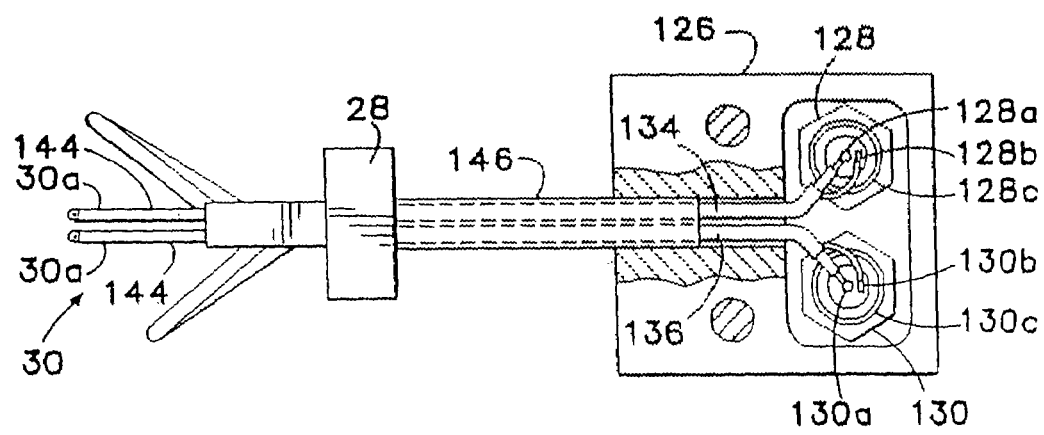
FIG. 9 is a partially sectional bottom view taken along line 9-9 of FIG. 8.

With reference to FIGS. 5B, 8 and 9, respective individually movable probes 30 comprising pairs of probe elements 30*a* are supported by respective probe holders 28 which in turn are supported by respective extending portions 26 of different probe positioners such as 24. Atop each probe positioner 24 is a shield box 126 having a pair of triaxial connectors 128, 130 mounted thereon with respective triaxial cables 132 entering each triaxial connector from a suitable test instrument as mentioned previously. Each triaxial connector includes a respective inner connector element 128*a*, 130*a*, an intermediate connector element 128*b*, 130*b*, and an outer connector element 128*c*, 130*c* in concentric arrangement. Each outer connector element 128*c*, 130*c* terminates by connection with the shield box 126. Conversely, the inner connector elements 128*a*, 130*a*, and the intermediate connector elements 128*b*, 130*b*, are connected respectively to the inner and outer conductors of a pair of coaxial cables 134, 136 which therefore are guarded cables. Each cable 134, 136 terminates through a respective coaxial connector 138, 140 with a respective probe element 30*a* having a center conductor 142 surrounded by a guard 144. In order to provide adequate shielding for the coaxial cables 134, 136, especially in the region outside of the octagonal box 48, an electrically-conductive shield tube 146 is provided around the cables 134, 136 and electrically connected through the shield box 126 with the outer connector element 128*c*, 130*c* of the respective triaxial connectors 128, 130. The shield tube 146 passes through the same slit in the foam 50 as does the underlying extending member 26 of the probe positioner 24. Thus, each individually movable probe 30 has not only its own separate individually movable probe holder 28 but also its own individually movable shield 146 for its guarded coaxial cables, which shield is movable in unison with the probe holder independently of the movement of any other probe holder by any other positioning mechanism 24. This feature is particularly advantageous because such individually movable probes are normally not equipped for both shielded and guarded connections, which deficiency is solved by the described structure. Accordingly, the probes 30 are capable of being used with the same guarding and Kelvin connection techniques in a ready-to-use manner as is the chuck assembly 20, consistently with full shielding despite the individual positioning capability of each probe 30.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe station comprising:
   (a) a chuck including a chuck surface for supporting a test device;
   (b) at least one support for a probe to contact said test device;
   (c) an enclosure defining an upper aperture for receiving said support; and
   (d) a conductive lower member conductively isolated from said chuck surface and slidably supported within said enclosure; said lower member defining a lower aperture for said enclosure capable of relative lateral movement with respect to said upper aperture.

2. The probe station of claim 1 wherein said lower member comprises a plurality of overlapping relatively slidable plates of different sizes and defining apertures of different sizes.

3. The probe station of claim 1 further comprising a positioner extending through said lower aperture, movement of said positioner moving said lower aperture laterally relative to said upper aperture.

4. The probe station of claim 3, wherein said enclosure has an upper member extending substantially laterally over said chuck.

5. The probe station of claim 3 wherein said positioner includes a motor assembly beneath said lower member for moving said positioner.

6. The probe station of claim 1 wherein said enclosure includes a door for selectively accessing said chuck.

7. The probe station of claim 1, said enclosure substantially shielding said chuck against electromagnetic interference.

8. The probe station of claim 1, said enclosure substantially shielding said chuck against light.

9. The probe station of claim 1, said enclosure limiting fluid communication between the interior and exterior of said enclosure.

* * * * *